United States Patent [19]

Steininger

[11] Patent Number: 4,957,604
[45] Date of Patent: Sep. 18, 1990

[54] PRODUCTION OF A THIN X-RAY AMORPHOUS ALUMINUM NITRIDE OR ALUMINUM SILICON NITRIDE FILM ON A SURFACE

[75] Inventor: Helmut Steininger, Worms, Fed. Rep. of Germany

[73] Assignee: BASF Aktiengesellschaft, Ludwigshafen, Fed. Rep. of Germany

[21] Appl. No.: 300,975

[22] Filed: Jan. 24, 1989

[30] Foreign Application Priority Data

Feb. 2, 1988 [DE] Fed. Rep. of Germany ....... 3802998

[51] Int. Cl.$^5$ .............................................. C23C 14/34
[52] U.S. Cl. .......................... 204/192.16; 204/192.15; 204/192.2
[58] Field of Search ...................... 204/192.15, 192.16, 204/192.22, 192.23

[56] References Cited

U.S. PATENT DOCUMENTS 4,529,651 7/1985 Kitoo et al. ................. 204/192.2 X
4,851,096 7/1989 Yamada et al. ............ 204/192.23 X

FOREIGN PATENT DOCUMENTS 0233062 8/1987 European Pat. Off. .
3500314 7/1985 Fed. Rep. of Germany .

OTHER PUBLICATIONS

J. M. Lagorsse & B. Serzec, "Proceedings of the Seventh National Vacuum Congress and 3rd International Conference of Solid Surfaces", Wien 1977, S. 1995-1997.

F. Takeda, T. Mori, T. Takahashi "Japanese Journal of Applied Physics", Band 20, Nr. 3, März 1981, S. L 164–L 172.

Li Xinjiao, Xu Zechuan, He Ziyou, Cao Huazhe, Su Wuda, Chen Zhougcai, Zhou Feng & Wang Enguang "Thin Solid Films", Band 139, 1986, S. 261-274.

S. Bhat, S. Ashok, S. J. Fonash & L. Tongson "Journal of Electronic Materials", Band 14, Nr. 4, 1985, S. 405-418.

C. R. Aita, C. J. Gawlak "Journal of Vacuum Science and technology" Band A 1, Nr. 2, Apr.-Jun. 1983, S. 403-496.

*Primary Examiner*—Nam X. Nguyen
*Attorney, Agent, or Firm*—Keil & Weinkauf

[57] ABSTRACT

A thin X-ray amorphous aluminum nitride or aluminum silicon nitride film is produced on a surface by vaporization of aluminum or of aluminum and silicon by reactive sputtering or reactive magnetron sputtering under reduced pressure in a process gas atmosphere, so that a sputter gas results, and deposition of the aluminum nitride or of the aluminum silicon nitride from the sputter gas onto the said surface, resulting in the said thin X-ray amorphous aluminum nitride or aluminum silicon nitride film, by a process in which the said process gas atmosphere consists essentially of nitrogen and argon and one or more further noble gases selected from the group consisting of neon, krypton and xenon, the volume ratio of argon to the further noble gases being from 2:1 to 100:1 and the volume ratio of the further noble gases to nitrogen being from 2:1 to 10:1.

13 Claims, No Drawings

PRODUCTION OF A THIN X-RAY AMORPHOUS ALUMINUM NITRIDE OR ALUMINUM SILICON NITRIDE FILM ON A SURFACE

FIELD OF THE INVENTION

The present invention relates to a novel, improved process for the production of a thin X-ray amorphous aluminum nitride or aluminum silicon nitride film on a surface by reactive sputtering or reactive magnetron sputtering of aluminum or of aluminum and silicon under reduced pressure in a process gas atmosphere containing a noble gas and nitrogen and by depositing the relevant nitride film from the gas phase.

DESCRIPTION OF THE RELATED ART

In reactive sputtering, it is known that the material of a target is converted into the gas phase, i.e. sputtered, by bombardment with argon ions. Reactive gaseous components, for example oxygen or nitrogen, which together with the sputtered target material are deposited as a thin oxide or nitride film on the surface to be coated, are mixed with the process gas obtained in this manner. In reactive magnetron sputtering, it is known that the target is present in a magnetic field. By varying process parameters, such as sputtering rate and deposition rate and process gas pressure and composition, thin films of different compositions and/or different morphologies can be produced.

Processes for the production of thin polycrystalline or semiamorphous aluminum nitride films or X-ray amorphous aluminum silicon nitride films are known.

For example, EP-A- No. 0 233 062 discloses a process for the production of a thin X-ray amorphous aluminum silicon nitride film, in which
(i) an $Si_{40}Al_{60}$ target and, as the process gas, argon and nitrogen in a volume ratio of 1.5:1 or
(ii) an $Si_{80}Al_{20}$ target and, as the process gas, argon and nitrogen in a volume ratio of 4:1
are used. As disclosed on page 7, lines 58 to 62, of this Laid-Open Application, only polycrystalline aluminum nitride films can be produced in this manner.

Furthermore, the paper by J. M. Lagorsse and B. Serzec in Proceedings of the Seventh International Vacuum Congress and 3rd International Conference on Solid Surfaces, Vienna 1977, pages 1995–1997, discloses the production of aluminum nitride films by reactive sputtering of aluminum in nitrogen or in nitrogen and hydrogen as process gas, the paper by F. Takeda, T. Mori and T. Takahashi in Japanese Journal of Applied Physics, Volume 20, March 1981, Number 3, pages L164–L172, discloses the production of aluminum nitride films by reactive magnetron sputtering of aluminum in nitrogen or in nitrogen and hydrogen as process gas, the paper by Li Xinjiao, Xu Zechuan, He Ziyou, Cao Huazhe, Su Wuda, Chen Zhongcai, Zhou Feng and Wang Enguang in Thin Solid Films, 139 (1986), 261–274, discloses the production of aluminum nitride films by high-frequency sputtering of aluminum in a mixture of argon and nitrogen in a volume ratio of 1:1 as process gas, the paper by S. Bhat, S. Ashok, S. J. Fonash and L. Tongson in Journal of Electronic Materials, Volume 14, 1985, Number 4, pages 405–418, discloses the production of aluminum nitride films by reactive ion beam sputtering in a mixture of nitrogen and hydrogen, and the paper by C. R. Aita and C. J. Gawlak in Journal of Vacuum Science and Technology, Volume A1, April-June 1983, Number 2, pages 403–406, discloses the production of semiamorphous aluminum nitride films by high-frequency sputtering in a mixture of argon and nitrogen of varying composition as process gas.

Moreover, Example 1 of DE-A-No. 35 00 314 discloses a process for the production of a film of a mixture of silicon nitride and silicon oxide by reactive vapor deposition of silicon in a mixture of nitrogen, oxygen and argon in a volume ratio of 2:1:7 as process gas. Example 2 of DE-A-No. 35 00 314 furthermore discloses a process for the production of a film of a mixture of aluminum nitride and aluminum oxide by reactive sputtering of aluminum in a mixture of nitrogen, oxygen and argon in a volume ratio of 2.5:0.5:7.0. DE-A-No. 35 00 314 does not disclose whether these films are X-ray amorphous or polycrystalline, i.e. whether they no longer give diffraction patterns when exposed to X-rays or whether they consist of crystallites whose size is in the nanometer range.

The conventional processes for the production of thin aluminum nitride or aluminum silicon nitride films have disadvantages.

For example, the known process for the production of thin X-ray amorphous aluminum silicon nitride films cannot be used for aluminum nitride. In addition, the conventional processes for the production of thin aluminum nitride films give polycrystalline films, the orientation of the crystallites furthermore being greatly dependent on the nature of the surface to which they are applied. Although the orientation of the crystallites (c axis at right angles or parallel to the surface) can, to a certain extent, be altered by the addition of hydrogen to the particular process gas used, i.e. nitrogen or argon and nitrogen, this does not result in X-ray amorphous aluminum nitride films.

It is now known from many areas of industry that X-ray amorphous films very generally provide better corrosion protection than polycrystalline ones, because intercrystalline diffusion of corrosive substances and/or destruction of the films via intercrystalline corrosion do not occur in the X-ray amorphous films. In general, there is therefore a considerable need for processes which permit the production of X-ray amorphous films in a simple and reliable manner.

To date, this need could not be met at all in the case of aluminum nitride and aluminum silicon nitride films, or could not be met in the manner required in practice. This is a particularly serious disadvantage, particularly when the known processes are used for the production of sheet-like, multilayer magneto-optical recording materials. It is precisely in this industrial area that the reliable and long-lasting protection of the extremely air-sensitive and water-sensitive magnetooptical recording layers (B) from corrosion is an urgent problem, but one which cannot yet be completely solved by the aluminum nitride or aluminum silicon nitride films produced by the known processes.

SUMMARY OF THE INVENTION

It is an object of the present invention to provide a novel, improved process for the production of a thin X-ray amorphous aluminum nitride or aluminum silicon nitride film on a surface, in which aluminum or aluminum and silicon is or are subjected to reactive sputtering or reactive magnetron sputtering under reduced pressure in a process gas atmosphere containing a noble gas and nitrogen, and which does not have the disadvantages of the prior art but gives thin X-ray amorphous aluminum nitride and aluminum silicon nitride films in a reliable and simple manner, the said films having an excellent property profile.

I have found that this object is achieved by a process for the production of a thin X-ray amorphous aluminum nitride or aluminum silicon nitride film on a surface by reactive sputtering or reactive magnetron sputtering of aluminum or of aluminum and silicon under reduced pressure in a process gas atmosphere containing a noble gas and nitrogen and by depositing the relevant nitride film from the gas phase, wherein (a) the noble gas used is a mixture of argon and one or more of the noble gases neon, krypton and xenon, (b) the volume ratio of argon to the other noble gases being from 2:1 to 100:1 and (c) the volume ratio of the noble gas mixture (a) to nitrogen being from 2:1 to 10:1.

The process for the production of a thin X-ray amorphous aluminum nitride or aluminum silicon nitride film on a surface is referred to below as the novel process for the sake of brevity.

The novel process has no special features in terms of apparatus but is carried out in the conventional and known apparatuses for reactive (magnetron) sputtering. These apparatuses essentially consist of one or more high vacuum chambers which have the conventional and for known locks for introducing the materials to be coated and for removing the coated materials, apparatuses for rotating the materials to be coated, connections to electric current and voltage sources, heating and cooling means, cathodes and anodes of suitable form, strong magnets if required, suitable energy sources for producing ions, means for feeding in the process gases, vacuum connections and the appropriate conventional and known electronic and mechanical measuring and control means.

Targets are introduced into these apparatuses and placed on the cathode. The targets are usually disks or plates of aluminum or of aluminum and silicon or of aluminum/silicon alloys.

The materials to be coated are also introduced into the apparatuses. The materials may be of different forms and compositions. For example, silicon wafers or other semiconductor wafers, glass, polymer films, metal films, dye layers, etc. can be used.

After the target and the materials to be coated have been introduced, the apparatuses are evacuated ($10^{-5}$ to $10^{-6}$ mbar). If necessary, this is followed by pretreatment of the target and of the surface of the materials which is to be coated, for example preliminary sputtering and deposition of aluminum and/or silicon on the relevant surface in the presence of argon.

After this preparation of the (magnetron) sputtering apparatus, the novel process is carried out.

In the novel process, the aluminum or aluminum/silicon target is sputtered. In this procedure, the process gas atmosphere contains a mixture of noble gases and nitrogen, a mixture (a) of argon and one or more of the noble gases neon, krypton and xenon being used as noble gases.

According to the invention, the volume ratio (b) of argon to the other noble gases is from 2:1 to 100:1, because this range permits reliable and safe deposition of advantageous, thin X-ray amorphous aluminum nitride and silicon nitride films. In general, it is not necessary to choose the volume ratio (b) of argon to the other noble gases as less than 2:1, i.e. to use a greater relative amount of the noble gases neon, krypton and xenon because this results in only a comparatively slight increase in the already excellent success of the process, i.e. thin X-ray amorphous aluminum nitride or aluminum silicon nitride films. On the other hand, the volume ratio (b) should not exceed 100:1, since polycrystalline or semiamorphous films are then more frequently deposited instead of the desired X-ray amorphous ones. According to the invention, volume ratios (b) of from 3:1 to 80:1, preferably from 3.5:1 to 50:1, in particular from 4:1 to 30:1 are advantageous, volume ratios (b) of from 4:1 to 30:1 being noteworthy because the use of these volume ratios (b) results in particularly advantageous aluminum nitride and aluminum silicon nitride films. Within this range, it is therefore possible for the volume ratios (b) to be advantageously varied and adapted to the other process parameters.

According to the invention, the volume ratio (c) of the noble gas mixture (a) to nitrogen is from 2:1 to 10:1. When volume ratios (c) within this range are used, advantageous, thin X-ray amorphous aluminum nitride and silicon nitride films are obtained. It is not advisable to use volume ratios (c) of less than 2:1, i.e. comparatively large amounts of nitrogen, since this often results in polycrystalline or semiamorphous films instead of the desired amorphous films, and the deposition rates of the nitride films are reduced to such an extent that they no longer meet the industrial requirements but are acceptable only in special cases. On the other hand, the volume ratio (c) should not exceed 10:1, since, on the one hand, this results in only a relatively small increase in the success of the process and, on the other hand, the deposited films contain insufficient nitrogen. According to the invention, a volume ratio of from 3.5:1 to 6.5:1 is advantageous, the range from 4:1 to 6:1 being particularly advantageous because within this range the volume ratio (c) can be particularly advantageously varied and adapted to the other process parameters.

The deposition rates known to be used in (magnetron) sputtering are about 0.5 to 2 $nm.s^{-1}$. These deposition rates are also suitable for the novel process.

The cathode power P in (magnetron) sputtering is known to be from 0.1 to 10 kW, preferably from 0.5 to 8 kW, advantageously from 0.6 to 5 kW, in particular from 0.8 to 2.5 kW. This cathode power P is also used in the novel process.

In (magnetron) sputtering, the process gas atmosphere is usually under a very low pressure. This pressure is in general from $10^{-4}$ to $5.10^{-3}$ mbar, i.e. the process gas atmosphere is a vacuum in the usual sense, the residual gas composition of which, however, is adjusted very exactly. In the novel process too, the process gas atmosphere to be used according to the invention is under this pressure.

The process gas of the novel process may contain hydrogen because, in many cases, the presence of hydrogen further increases the success of the process. If hydrogen is concomitantly used, the volume ratio (d) of nitrogen to hydrogen is from 2:1 to 20:1. This is an optimum range within which the hydrogen content can be freely selected and can be adapted to the other process parameters in a suitable manner.

The parameters of the novel process are chosen from the abovementioned ranges of the volume ratios (b) and (c) of the process gases to be used according to the invention, these ranges being obligatory according to the invention. Moreover, the process parameters can be selected from the abovementioned optional ranges for the volume ratio (d) of nitrogen to hydrogen, for the deposition rate, for the cathode power P and for the process gas pressure. It is advantageous if all these parameters are selected from the stated ranges.

To a certain extent, the narrower choice of the process parameters, i.e. the process conditions, depends on the nature of the surface on which the thin X-ray amorphous aluminum nitride and aluminum silicon nitride films are deposited. This narrower choice can be made on the basis of simple preliminary experiments.

Examples of suitable process conditions or combinations of process parameters which prove suitable in the case of many different surfaces and which give advantageous, thin X-ray amorphous aluminum nitride and aluminum silicon nitride films are:

I. $10^{-3}$ mbar Ar, $5.10^{-4}$ mbar Ne, $2.10^{-4}$ mbar $N_2$, deposition rate: 0.9 nm.s$^{-1}$, P=1 kW;

II. $10^{-3}$ mbar Ar, $4.10^{-4}$ mbar Ne, $2.10^{-4}$ mbar $N_2$, $8.10^{-5}$ mbar $H_2$, deposition rate: 1.1 nm.s$^{-1}$, P=1.2 kW;

III $3.10^{-3}$ mbar Ar, $5.10^{-4}$ mbar Kr, $2.5.10^{-4}$ mbar $N_2$, deposition rate: 1 nm.s$^{-1}$, P=1 kW;

IV. $2.10^{-3}$ mbar Ar, $2.10^{-4}$ mbar Xe, $2.10^{-4}$ mbar Kr, $3.10^{-4}$ mbar $N_2$, deposition rate: 0.9 nm.s$^{-1}$, P=1 kW;

V. $2.10^{-3}$ mbar Ar, $10^{-4}$ mbar Xe, $10^{-4}$ mbar Ne, $4.2.10^{-4}$ mbar $N_2$, $4.2.10^{-5}$ mbar $H_2$, deposition rate: 1.2 nm.s$^{-1}$, P=1.2 kW; or VI. $3.10^{-3}$ mbar Ar, $1.5.10^{-4}$ mbar Xe, $5.7.10^{-4}$ mbar $N_2$, deposition rate: 1.1 nm.s$^{-1}$, P=1.5 kW.

The novel process has many particular advantages.

For example, the novel process makes it possible to produce thin X-ray amorphous aluminum nitride or aluminum silicon nitride films on a very wide range of surfaces, for example those of semiconductor wafers, glass, polymers, metal films or dye layers. Here, the novel process proves particularly advantageous when it is used to produce thin X-ray amorphous aluminum nitride or aluminum silicon nitride films, i.e. films having a thickness of from 0.1 to 1,000 nm. These films produced by the novel procedure have excellent performance characteristics, so that they can be used as, for example, electrical insulating films, optical waveguides, conductors of acoustic waves, protective films for integrated circuits (microchips) or interference and/or protective films in sheet-like, multilayer laser-optical and magneto-optical recording materials having water-sensitive and air-sensitive recording layers.

It is precisely in the technical area of the sheet-like, multilayer laser-optical and magneto-optical recording materials that the advantages of the novel process are displayed: for example, not only are the products obtained by this process very suitable for the stated intended uses but the novel process itself can be efficiently integrated in the process for the production of these recording materials.

Sheet-like, multilayer laser-optical and magnetooptical recording materials which generally contain an optically transparent dimensionally stable substrate (A) and a thermally alterable recording layer (B) are known.

The term sheet-like includes all spatial forms whose thickness is considerably smaller than their length and width. Accordingly, the recording materials in question may be tape-like, plate-like or disk-like recording materials, the disk-like ones generally also being referred to as disks.

In the recording layers (B) of laser-optical recording materials, digital data are recorded with the aid of pulse-modulated write laser beams, in the form of thermally altered areas. The write laser beams are focused on the recording layers (B) and/or strike them at right angles. For recording analog data, continuous-wave lasers can also be used. In the case of recorded digital data, the thermally altered areas of the recording layers (B) have a circular or elliptical base surface. In the case of analog data, the thermally altered areas have a base surface of any shape.

The data are generally read using continuously emitted read laser beams (continuous-wave laser beams) whose energy is insufficient to cause further changes in the recording layers (B). The read laser beams are likewise focused on the recording layers (B) and/or strike them at right angles. In the read process, the light reflected by the recording layers (B) is generally collected with the aid of suitable optical arrangements, fed to conventional and known detectors and converted into signals by suitable electronic apparatuses.

The term laser-optical is therefore generally applied to these write and read processes and the corresponding recording materials suitable for this purpose.

The thermally altered areas of the recording layers (B) may be in the form of holes which completely penetrate the recording layer. In this case, the term ablative laser-optical recording of data is generally used. When the data are read using a read laser beam, the different reflectivities of the holes and of the unaltered areas of the recording layer (B) are utilized. In order to obtain high sensitivity and a high signal/noise ratio here, it is also possible to use a reflector film, which is exposed by hole formation and reflects the read laser beam particularly strongly.

The thermally altered areas may also be in the form of pits, which may have a well defined wall. In this case, the term deformative laser-optical recording of data is used. Here, the data are read via diffraction of the light of the read laser beam at the pits.

As a result of the thermal alteration, however, it is also possible for areas to form in which, instead of ablation or deformation, a phase transformation of the material of the recording layer (B) into another modification has taken place. In such a case, the process is referred to as laser-optical recording of data by phase transformation. In general, the phase transformation reduces the reflectivity in the recorded areas and/or increases the light transmittance. However, in certain circumstances the opposite effect may also occur, i.e. the reflectivity is increased and/or the light transmittance is reduced. In general, the areas thermally altered in this manner are referred to as spots.

The recording layers (B) can, however, also have lower films which expand or evolve gases on exposure to light, with the result that the recording layers (B) are locally expanded. In this way, relief structures form in the surface of the recording layers (B), the said relief structures containing the recorded data.

However, the gases may also be liberated in the recording layers (B) themselves, with formation of small light-scattering bubbles. This is generally referred to as vesicular data recording.

Furthermore, a chemical reaction of a component or a chemical reaction between a plurality of components of the recording layers (B) may have taken place in the thermally altered areas, with the result that the optical properties of the recording layers (B) in these areas have been changed.

A local increase in the reflectivity of recording layers (B) during exposure to light can, however, also be caused by an increase in size or fusion of small particles. These small particles, for example gold particles may be embedded in a matrix. However, they may also be small plastic spheres coated with metal by vapor deposition.

Recording layers (B) which consist of these small spheres have a very low basic reflectivity.

A particularly advantageous recording layer (B) which is especially suitable for ablative or deformative recording of data is known to consist of tellurium, which is very water-sensitive and air-sensitive. The thin X-ray amorphous aluminum nitride or aluminum silicon nitride films which are applied to the tellurium layer (B) by the novel process are known to provide excellent corrosion protection for the tellurium layer (B), to prolong its life and to improve its signal/noise ratio.

Furthermore, the thermally altered areas in recording layers (B), which consist of amorphous ferrimagnetic layers magnetized at right angles to their surface, may be in the form of spots which have a magnetization direction opposite to the original direction. These spots are formed during heating of the ferrimagnetic material of these layers by a laser beam under the influence of an applied (external) auxiliary magnetic field or of a magnetic field immanent (intrinsic) to the recording layer (B). As a result of heating, the coercive force Hc of the ferrimagnetic material decreases. If the coercive force Hc falls below the field strength of the external or intrinsic magnetic field at a critical temperature dependent on the particular material used, the relevant area is magnetically reversed.

If necessary, the recorded data can be deleted again by controlled local heating of the recording layer (B), for example by means of a laser beam, in the presence of an external or intrinsic magnetic field whose field lines are aligned at right angles to the layer surface, after which data can be recorded again in the manner described above, i.e. the write process is reversible.

The thermally altered areas are read using linearly polarized light of a continuously emitting continuous-wave laser whose light power is insufficient to heat the material above the critical temperature. This laser beam is reflected either by the recording layer (B) itself or by a reflector layer arranged behind the said recording layer, the magnetic moments in the recording layer (B) interacting with the magnetic vector of the laser light wave. As a result of this interaction, the plane of polarization $\vec{E}$ of the laser light reflected by a spot or by a reflector film behind it is rotated through a small angle with respect to the original plane. If this rotation of the plane of polarization $\vec{E}$ takes place during reflection of the light at the recording layer (B) itself, this is referred to as the Kerr effect and the angle is accordingly referred to as the Kerr angle; if, on the other hand, the plane is rotated during passage of the light twice through the recording layer, the terms Faraday effect and Faraday angle are used.

This rotation of the plane of polarization $\vec{E}$ of the laser light reflected by the recording material can be measured and converted into signals by means of suitable optical and electronic apparatuses.

The term magneto-optical is therefore generally applied to recording layers (B) of this type.

In the case of multilayer laser-optical and magneto-optical disks, the conventional and known disk drives are generally used for writing and reading digital data. Such a disk drive essentially contains a disk turntable and a laser-optical read-write head, as well as mechanical servo means for correction of tracking, autofocusing means, optical elements for analyzing tracking and autofocusing errors, detector means with upstream optical components for collecting the read laser light reflected by the disks, and suitable electronic components. Usually, a laser-optical read-write head contains laser diodes, which emit infrared light, and consist of semiconductor materials, such as GaAlAs. Moreover, such a read-write head generally also has further suitable optical components, such as dielectric beam dividers, polarization beam dividers or polarization-independent beam dividers and a quarter-wave or half-wave plate.

The particular advantages of the novel process are illustrated in an outstanding manner by the magnetooptical recording materials.

It is known that sheet-like, multilayer magnetooptical recording materials which comprise (A) an optically transparent dimensionally stable substrate, (B) a thermally alterable recording layer consisting of a lanthanide/transition metal alloy and (C) an aluminum nitride and/or aluminum silicon nitride film on one or both sides of the recording layer (B)

are produced by a process in which (i) the individual layers (B) and films (C) are applied to the substrate (A) in the desired order, number and thickness and with the particular internal structure desired, via the gas phase, (ii) the film(s) (C) are produced by reactive sputtering or reactive magnetron sputtering of aluminum or of aluminum and silicon under reduced pressure in a process gas atmosphere containing a noble gas and nitrogen, after which (iii) a defined magnetization oriented at right angles to the surface of the recording layer (B) is induced in the said recording layer.

In this procedure, it proves to be very particularly advantageous if the novel process described in detail above is used to produce the film(s) (C), the process fitting readily and efficiently into the process for the production of the sheet-like, multilayer magnetooptical recording material.

An additional advantage is obtained if an oxide film (C') is produced in a conventional manner on at least the thin X-ray amorphous aluminum nitride or aluminum silicon nitride film which faces away from the substrate (A) and has been produced by the novel process, the thickness of the oxide film (C') being from 0.2 to 0.8, in particular from 0.25 to 0.75, times the thickness of the film (C).

If the thickness of the film (C') is from 0.25 to 0.75 times the thickness of the film (C), the following oxides are particularly suitable for producing the film (C'): $Al_2O_3$, $SiO_2$, $SiO$, $PbO$, $Pb_2O_3$, $SnO_2$, $Y_2O_3$, $ZrO_2$, $HfO_2$, $MoO_3$, $Nb_2O_5$, $Ta_2O_5$, $TiO_2$, $ThO_2$ and the oxide formed by the composition I $$(Al_xSi_{1-x})_{1-z}(M^1_rM^2_sM^3_t)_z \quad \text{I}$$

where the indices and the variables have the following meanings:

$M^1$, $M^2$ and $M^3$ are each Ti, Zr, Hf, Th, Sc, Y, La, Ce, Pr, Nd, Sm, Eu, Gd, Tb, Dy, Ho, Er, Tm, Yb, Lu, V, Nb, Ta, Cr, Mo, W, Mn, Re, Fe, Co, Rh, Cu, Zn, Mg, Ca, Sr, Ba, B, Ga, In, Tl, Ge, Sn, Pb, P, As, Sb and Te, with the provisos that $M^1$, $M^2$ and $M^3$ differ from one another or that they are identical or different if $M^1$, $M^2$ and $M^3$ are lanthanum or a lanthanide, x is from 0 to 1, z is r+s+t, r and s are each from 0.005 to 0.15 and t is from 0 to 0.005.

Advantageous substrates (A) are the conventional and known, disk-shaped, optically transparent, dimensionally stable substrates (A) having a diameter of 90 or 130 mm and a thickness of 1.2 mm. They generally consist of glass or of plastics, for example polycarbonate, polymethyl methacrylate, polymethylpentene, cellulose acetobutyrate or a mixture of poly(vinylidene fluoride) and polymethyl methacrylate or polystyrene and poly(2,6-dimethylphen-1,4-ylene ether). Among these, the substrates (A) consisting of plastics are particularly advantageous.

That surface of the substrate (A) which faces the recording layer (B) may have structures.

The structures in the surface of the substrate (A) are in the micrometer and/or submicrometer range. They are used for exact guidance of the read laser beam and ensure a rapid and exact response of the tracking servo and autofocusing means in the laser-optical readwrite heads of the disk drives, i.e. they permit or improve tracking. Moreover, these structures may themselves be data, as is the case, for example in the known audio or video compact disks, or they may be used for coding the recorded data. The structures consist of raised parts and/or indentations. These are in the form of continuous concentric or spiral tracks or in the form of isolated hills and/or holes. Furthermore, the structure may have a more or less smooth wave form. The tracks are preferred. In their transverse direction, they have a rectangular sawtooth-like, V-shaped or trapezoidal contour. Their indentations are generally referred to as grooves and their raised parts as land. Tracks having 50-200 nm deep and 0.4-0.8 $\mu$m wide grooves which are separated in each case by a 1-3 $\mu$m wide land are advantageous.

Advantageous magneto-optical recording layers (B) essentially contain an amorphous lanthanide/transition metal alloy. These recording layers (B) are generally from 10 to 500 nm thick. The lanthanides Pr, Nd, Sm, Eu, Gd, Tb, Dy and Ho and the transition metals Fe and Co are suitable for producing the recording layers (B). Suitable mixing ratios of lanthanides with transition metals are known from the prior art. Furthermore, the amorphous lanthanide/transition metal alloy may also contain further elements, such as Sc, Y, La, V, Nb, Ta, Cr, Mo, W, Mn, Ni, Re, Ru, Os, Rh, Ir, Pd, Pt, Cu, Ag, Au, Zn, B, Al, Ga, In, Si, Ge, Sn, Pb, P, As, Sb and/or Bi, in conventional and known amounts.

In addition, the magneto-optical recording material may contain further films which are useful for the functioning of the recording material. These are the conventional and known interference films, reflector films, anticorrosion films, adhesion-promoting layers and other magnetizable layers. Furthermore, two magnetooptical recording materials can be connected to one another in the form of a sandwich, so that their recording layers (B) face one another and are a certain distance apart, the conventional and known techniques for joining two recording materials being used.

Data in the form of magnetically reversed spots can be recorded on the sheet-like, multilayer magnetooptical recording materials which contain one or two of the films (C) produced by the novel procedure, recording being effected in the conventional manner from the side bearing the optically transparent dimensionally stable substrate (A) using a pulse-modulated write laser beam which is focused on the recording layers (B) and/or strikes the said layers at right angles and which has a wavelength of less than 1,000 nm. Thereafter, the data can be read with the aid of a continuous-wave laser beam which is focused on the recording layers (B) containing the recorded data and/or which strikes the said recording layers at right angles, the light reflected by the recording layers (B) themselves or that reflected by any reflector films present being collected, analyzed and converted into signals. In the case of the disks, the conventional and known laser-optical disk drives having laser-optical heads which contain semiconductor lasers can be used for this purpose.

The sheet-like, multilayer magneto-optical recording materials which contain one or two of the film(s) (C) produced by the novel procedure have particular advantages over the prior art. For example, they have greater sensitivity than known recording materials and can therefore be written on using lower laser power. In the form of magneto-optical disks, they can therefore be written on at higher disk speeds than known disks, using the same laser power. Furthermore, their bit density is substantially higher compared with the prior art. During reading, they give undistorted signals and have a signal/noise ratio of more than 55 dB. Even after storage for more than 1,000 hours at 70° C. and at a relative humidity of 90%, there is no increase in the bit error rate, i.e. no loss of information.

Furthermore, the thin X-ray amorphous aluminum nitride and/or aluminum silicon nitride films (C) contained in the multilayer, sheet-like magneto-optical recording materials and produced by the novel procedure are scratch-resistant, hard, firmly bonded, mechanically strong and non-brittle. If these films (C) are used as anticorrosion films, they provide excellent protection for the extremely air-sensitive and water-sensitive recording layers (B). If they are employed as interference films between the substrates (A) and the recording layers (B), they are superior, in their optical compensation effect, to the interference films produced in a conventional and known manner. Furthermore, in this function too, the films (C) produced by the novel procedure display their excellent anticorrosion action and thus make a substantial contribution toward the particularly long life of the relevant sheet-like, multilayer magneto-optical recording materials.

DESCRIPTION OF THE PREFERRED EMBODIMENTS

Examples

Examples 1 to 6

Production of thin X-ray amorphous aluminum nitride and aluminum silicon nitride films by the novel process, and the performance characteristics of the films (C) thus obtained Experimental method:

The production of thin X-ray amorphous aluminum nitride and aluminum silicon nitride films (C) by the novel process was carried out as part of the production of the magneto-optical disks, and hence in a manner conforming to practice. The particular technical effect of the novel process was particularly evident from the advantageous properties of the recording materials.

Six disks having a diameter of 130 mm and a thickness of 1.2 mm, provided with tracks and consisting of a mixture of polystyrene and poly(2,6-dimethylphen-1,4-ylene ether) were used as substrates (A).

The individual layers (B) and films (C) were applied from the gas phase, in the desired number, order and thickness and with the particular internal structure desired, to that side of the six disks (A) which were provided with tracks, this being done while the disks (A) were rotated.

The X-ray amorphous interference film (C) consisting of aluminum silicon nitride was first applied to the surface of the substrate (A) by reactive magnetron sputtering of an aluminum/silicon target, the novel process being employed. The following process conditions were used here:

| EXAMPLE 1 | |
|---|---|
| Process gas: | $10^{-3}$ mbar Ar, $5.10^{-4}$ mbar Ne, $2.10^{-4}$ mbar $N_2$; |
| Deposition rate: | 0.9 $nm.s^{-1}$ |
| Cathode power: | P = 1 kW |

| EXAMPLE 2 | |
|---|---|
| Process gas: | $10^{-3}$ mbar Ar, $4.10^{-4}$ mbar Ne, $2.10^{-4}$ mbar $N_2$, $8.10^{-5}$ mbar $H_2$; |
| Deposition rate: | 1.1 $nm.s^{-1}$; |
| Cathode power: | P = 1.2 kW |

| EXAMPLE 3 | |
|---|---|
| Process gas: | $3.10^{-3}$ mbar Ar, $5.10^{-4}$ mbar Kr, $2.5.10^{-4}$ mbar $N_2$; |
| Deposition rate: | 1.0 $nm.s^{-1}$; |
| Cathode power: | P = 1 kW |

| EXAMPLE 4 | |
|---|---|
| Process gas: | $2.10^{-3}$ mbar Ar, $2.10^{-4}$ mbar Xe, $2.10^{-4}$ mbar Kr, $3.10^{-4}$ mbar $N_2$; |
| Deposition rate: | 0.9 $nm.s^{-1}$; |
| Cathode power: | P = 1 kW |

| EXAMPLE 5 | |
|---|---|
| Process gas: | $2.10^{-3}$ mbar Ar, $10^{-4}$ mbar Xe, $10^{-4}$ mbar Ne, $4.2.10^{-4}$ mbar $N_2$, $4.2.10^{-5}$ mbar $H_2$; |
| Deposition rate: | 1.2 $nm.s^{-1}$; |
| Cathode power: | P = 1.2 kW |

| EXAMPLE 6 | |
|---|---|
| Process gas: | $3.10^{-3}$ mbar Ar, $1.5.10^{-4}$ mbar Xe, $5.7.10^{-4}$ mbar $N_2$; |
| Deposition rate: | 1.1 $nm.s^{-1}$; |
| Cathode power: | P = 1.5 kW. |

Thereafter, the amorphous magneto-optical recording layers (B) consisting of a TbDyFe alloy were produced on the surface of the interference films (C) in a conventional and known manner by magnetron sputtering of a TbDyFe target.

The anticorrosion films (C) consisting of X-ray amorphous aluminum nitride (Examples 1 to 3) or of aluminum silicon nitride (Examples 4 to 6) were then applied to the surface of the recording layers (B) by the novel process, in this case too the abovementioned particular process conditions being used for the production of the films (C) in the individual Examples.

A tantalum oxide film (C') was also applied to the surface of the anticorrosion films (C) in Example 3, and a titanium dioxide film (C') was also applied to the said anticorrosion films in Example 6, this being done in a conventional and known manner by reactive magnetron sputtering in a process gas atmosphere containing argon and oxygen.

In the process for the production of the magnetooptical disks, the process conditions were selected in general so that the compositions of the disks 1 to 6, stated in Table 1, resulted.

To check the success of the process and for analytical purposes, a further six magneto-optical disks were produced, in each case under exactly comparable conditions (Examples 1a to 6a). These disks were used to investigate the morphology and the composition of the novel films (C) produced by the novel process, by means of conventional and known analytical methods, some of which cause degradation of material, such as elemental chemical analysis, optical microscopy, scanning electron microscopy, X-ray spectroscopy, X-ray scattering or diffraction, ESCA (electron spectroscopy for chemical analysis) and flame photometry. Furthermore, conventional and known non-destructive optical and spectroscopic methods were used to verify that the particular films (C) of the pairs of Examples (1, 1a) to (6, 6a) were identical to one another in each case, so that the composition and morphological parameters determined from Examples 1a to 6a could be included in Table 1.

The recording layers (B) of the magneto-optical disks of Examples 1 to 6 were magnetized at right angles to their surface directly after their production. The disks were then conditioned for 48 hours at 23°±2° C. under an air pressure of 103±3.5 kPa and at a relative humidity of from 45 to 55%.

Thereafter, data were recorded on the conditioned disks with the aid of a conventional and known disk drive under exactly comparable conditions. For this purpose, a pulse-modulated GaAlAs semiconductor laser which emitted linearly polarized light having a wavelength λ of 830 nm was used. The bit length, i.e. the diameter of the magnetically reversed spots, and the bit spacing, i.e. the distance from spot to spot, were about 1 pm.

To read the recorded data by the Kerr effect, the GaAlAs semiconductor laser was used in the continuous wave mode with a light power of less than 1 mW. The uncorrected bit error rate was determined in a conventional and known manner by means of a time-interval analyzer (TIA).

The disks were initially read directly after the recording process (first read operation). Thereafter, the disks were subjected to the accelerated life test typical for magneto-optical recording materials, at 60°, 70° and 80° C. and at a relative humidity of 90% and were then read again (second read operation). From the uncorrected bit error rates obtained and from the evaluation of the recording layers (B) of the disks by optical and scanning electron microscopy, their life under normal conditions (30° C., 90% relative humidity) was estimated. The relevant results are shown in Table 2.

Comparative Experiments C1 TO C6

Production of thin aluminum nitride and aluminum silicon nitride films by a known process, and the performance characteristics of the films (C) thus obtained Experimental method:

Examples 1 to 6 were repeated, except that the films (C) were produced by a known method of reactive magnetron sputtering. The following process conditions were used here:

Comparative Experiments C1 TO C6

Process gas: $4 \cdot 10^{-3}$ mbar Ar, $1 \cdot 10^{-3}$ mbar $N_2$;
Deposition rate: $1$ nm.s$^{-1}$;
P=1.5 kW.

The process conditions were chosen in general so that the compositions of the comparison disks C1 to C6, also shown in Table 1, resulted. The experimental results determined for the comparative disks C1 to C6 are compared with those from Examples 1 to 6 in Table 2.

Here, a direct comparison can be made between
Example 1 and Comparative Experiment C1,
Example 2 and Comparative Experiment C2,
Example 3 and Comparative Experiment C3,
Example 4 and Comparative Experiment C4,
Example 5 and Comparative Experiment C5 and
Example 6 and Comparative Experiment C6.

The comparison shows, in an unmistakable way, that the magneto-optical disks which contained the films (C) produced in the novel manner (Examples 1 to 6) were clearly superior to the magneto-optical disks which merely contained the films (C) produced in a known manner (Comparative Experiments C1 to C6). This confirms that the novel process has a particularly unexpected technical effect which is excellently displayed even in a more comprehensive process (production of magneto-optical disks).

TABLE 1

Production and composition of magneto-optical disks having films (C) produced by the novel procedure (Examples 1 to 6) and in a known manner (Comparative Experiments A to F)

| | Interference film (C) (nm) | Recording layer (B) (nm) | Anticorrosion film (C) (nm) | Oxide film (C') (nm) |
|---|---|---|---|---|
| Example No. | | | | |
| 1 | X-ray amorphous aluminum silicon nitride (75) | TbDyFe (80) | X-ray amorphous aluminum silicon nitride (100) | — |
| 2 | X-ray amorphous aluminum silicon nitride (80) | TbDyFe (90) | X-ray amorphous aluminum nitride (110) | — |
| 3 | X-ray amorphous aluminum silicon nitride (75) | TbDyFe (80) | X-ray amorphous aluminum nitride (100) | Polycrystalline $Ta_2O_5$ (25) |
| 4 | X-ray amorphous aluminum silicon nitride (85) | TbDyFe (85) | X-ray amorphous aluminum nitride (120) | — |
| 5 | X-ray amorphous aluminum silicon nitride (90) | TbDyFe (95) | X-ray amorphous aluminum silicon nitride (115) | — |
| 6 | X-ray amorphous aluminum silicon nitride (85) | TbDyFe (80) | X-ray amorphous aluminum nitride (100) | Polycrystalline $TiO_2$ (75) |
| Comp. Exp. | | | | |
| C1 | Semiamorphous aluminum silicon nitride (75) | TbDyFe (80) | Polycrystalline aluminum nitride (100) | — |
| C2 | Polycrystalline to semiamorphous aluminum silicon nitride (80) | TbDyFe (90) | Polycrystalline aluminum nitride (110) | — |
| C3 | Semiamorphous aluminum silicon nitride with amorphous areas (75) | TbDyFe (80) | Polycrystalline aluminum nitride (100) | Polycrystalline $Ta_2O_5$ (25) |
| C4 | X-ray amorphous aluminum silicon nitride (85) | TbDyFe (85) | Polycrystalline aluminum nitride (120) | — |
| C5 | X-ray amorphous aluminum silicon nitride with semiamorphous areas (90) | TbDyFe (95) | Polycrystalline aluminum silicon nitride (115) | — |
| C6 | X-ray amorphous aluminum silicon nitride (85) | TbDyFe (80) | Polycrystalline aluminum nitride (100) | Polycrystalline $TiO_2$ (75) |

TABLE 2

| Example | Experimental results Bit error rate (uncorrected) | | Life (years) | Pinhole corrosion[a] |
|---|---|---|---|---|
| | 1st read operation | 2nd read operation | | |
| 1 | $<10^{-5}$ | $10^{-5}$ | $\geq 15$ | No |
| 2 | $<10^{-5}$ | $<10^{-5}$ | $>15$ | No |
| 3 | $<10^{-5}$ | $<10^{-5}$ | $>15$ | No |
| 4 | $<10^{-5}$ | $<10^{-5}$ | $>15$ | No |
| 5 | $<10^{-5}$ | $10^{-5}$ | $\geq 15$ | No |
| 6 | $<10^{-5}$ | $<10^{-5}$ | $>15$ | No |
| Comparative Experiments | | | | |
| C1 | $10^{-5}$ | $3.10^{-4}$ | 10–11 | Yes |
| C2 | $10^{-5}$ | $7.10^{-4}$ | 10–11 | Yes |
| C3 | $10^{-5}$ | $9.10^{-4}$ | 12 | No |
| C4 | $10^{-5}$ | $6.10^{-4}$ | 10–11 | Yes |
| C5 | $10^{-5}$ | $5.10^{-4}$ | 11 | No |
| C6 | $10^{-5}$ | $10^{-5}$ | 12 | No |

[a] Investigation by optical microscopy and scanning electron microscopy

I claim:

1. A process for the production of a thin X-ray amorphous aluminum nitride film on a surface, comprising the following steps in the stated order:
   (1) production of a sputter gas by vaporization of aluminum by reactive sputtering or reactive magnetron sputtering under reduced pressure in a process gas atmosphere consisting essentially of nitrogen and argon and one or more further noble gases selected from the group consisting of neon, krypton and xenon, the volume ratio of argon to the further noble gases being from 2:1 to 100:1 and the volume ratio of the further noble gases to nitrogen being from 2:1 to 10:1, so that the sputter gas results, and
   (2) deposition of the aluminum nitride from the sputter gas onto the surface, resulting in the thin X-ray amorphous aluminum nitride film.

2. A process as described in claim 1, wherein the volume ratio of the further noble gases to nitrogen is from 3.5:1 to 6.5:1 in the process gas atmosphere.

3. A process as described in claim 2, wherein the process gas atmosphere contains hydrogen.

4. A process as described in claim 3, wherein the volume ratio of nitrogen to hydrogen is from 2:1 to 20:1 in the process gas atmosphere.

5. A process as claimed in claim 1, wherein the process gas atmosphere contains hydrogen.

6. A process as described in claim 5, wherein the volume ratio of nitrogen to hydrogen is from 2:1 to 20:1 in the process gas atmosphere.

7. A process for the production of a magneto-optical recording element, containing
   (A) an optically transparent dimensionally stable substrate,
   (B) a thermally alterable recording layer containing a lanthanide/transition metal alloy and
   (C) an aluminum nitride film on one or both sides of the said recording layer (B),
the said process comprising the following steps in the stated order:
   (i) application of a lanthanide/transition metal alloy to the surface of the said substrate (A), resulting in the said recording layer (B),
   (ii) production of a sputter gas by vaporization of aluminum by reactive sputtering or reactive magnetron sputtering under reduced pressure in a process gas atmosphere consisting essentially of nitrogen and argon and one or more further noble gases selected from the group consisting of neon, krypton and xenon, the volume ratio of argon to the further noble gases being from 2:1 to 100:1 and the volume ratio of the further noble gases to nitrogen being from 2:1 to 10:1, so that the sputter gas results, and deposition of the aluminum nitride from the sputter gas onto the surface of the recording layer (B), resulting in the said film (C), and
   (iii) induction of a defined magnetization in the recording layer (B), oriented at right angles to the surface.

8. A process as described in claim 7, wherein an aluminum nitride film (C) is produced on the surface of the substrate (A), prior to application of the recording layer (B), by
   (iv) production of a sputter gas by vaporization of aluminum by reactive sputtering or reactive magnetron sputtering under reduced pressure in a process gas atmosphere consisting essentially of nitrogen and argon and one or more further noble gases selected from the group consisting of xenon, neon and krypton, the volume ratio of argon to the further noble gases being from 2:1 to 100:1 and the volume ratio of the further noble gases to nitrogen being from 2:1 to 10:1, so that the sputter gas results, and
   (v) deposition of the aluminum nitride from the sputter gas onto the surface of the substrate (A), resulting in the said film (C).

9. A process as described in claim 7, wherein the volume ratio of the further noble gases to nitrogen is from 3.5:1 to 6.5:1 in the process gas atmosphere.

10. A process as described in claim 7, wherein the process gas atmosphere contains hydrogen.

11. A process as described in claim 10, wherein the volume ratio of nitrogen to hydrogen is from 2:1 to 20:1 in the process gas atmosphere.

12. A process as described in claim 7, comprising the following step:
   (vi) application of an oxide film (C') having a thickness of from 0.2 to 0.8 times the thickness of the said film (C) to the surface of the film (C) which is present on that side of the recording layer (B) which faces away from the substrate (A).

13. A process as described in claim 12, wherein the oxide film (C') has a thickness which is from 0.25 to 0.75 times the thickness of the said film (C) and consists of an oxide selected from the group consisting of $Al_2O_3$, $SiO_2$, $SiO$, $PbO$, $Pb_2O_3$, $SnO_2$, $Y_2O_3$, $ZrO_2$, $HfO_2$, $MoO_3$, $Nb_2O_5$, $Ta_2O_5$, $TiO_2$, $ThO_2$ and an oxide formed by the composition I $$(Al_xSi_{1-x})_{1-z}(M^1_rM^2_sM^3_t)_z \quad I$$

where the indices and the variables have the following meanings:

$M^1$, $M^2$ and $M^3$ are each Ti, Zr, Hf, Th, Sc, Y, La, Ce, Pr, Nd, Sm, Eu, Gd, Tb, Dy, Ho, Er, Tm, Yb, Lu, V, Nb, Ta, Cr, Mo, W, Mn, Re, Fe, Co, Rh, Cu, Zn, Ca, Mg, Sr, Ba, B, Ga, In, Tl, Ge, Sn, Pb, P, As, Sb and Te, with the provisos that $M^1$, $M^2$ and $M^3$ differ from one another or that they are identical or different if $M^1$, $M^2$ and $M^3$ are lanthanum or a lanthanide, x is from 0 to 1, z is r+s+t, r and s are each from 0.005 to 0.15 and t is from 0 to 0.005.

* * * * *